United States Patent
Barnes et al.

(10) Patent No.: US 7,358,112 B2
(45) Date of Patent: Apr. 15, 2008

(54) METHOD OF GROWING A SEMICONDUCTOR LAYER

(75) Inventors: Jennifer Mary Barnes, Oxfordshire (GB); Valerie Bousquet, Oxford (GB); Stewart Edward Hooper, Oxfordshire (GB); Jonathan Heffernan, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 189 days.

(21) Appl. No.: 10/480,203

(22) PCT Filed: Jun. 13, 2002

(86) PCT No.: PCT/JP02/05931

§ 371 (c)(1),
(2), (4) Date: May 24, 2004

(87) PCT Pub. No.: WO02/103090

PCT Pub. Date: Dec. 27, 2002

(65) Prior Publication Data

US 2004/0214412 A1    Oct. 28, 2004

(30) Foreign Application Priority Data

Jun. 13, 2001   (GB) ............................... 0114378.3

(51) Int. Cl.
   *H01L 21/00* (2006.01)
(52) U.S. Cl. ............... 438/93; 438/46; 438/933; 438/22; 438/604; 438/479; 257/E21.09
(58) Field of Classification Search ............ 438/93, 438/46, 933, 22, 604, 479; 257/E21.09
See application file for complete search history.

(56) References Cited

U.S. PATENT DOCUMENTS

| 5,657,335 A | 8/1997 | Rubin et al. |
| 6,111,277 A * | 8/2000 | Ikeda .......................... 257/99 |
| 6,524,882 B2 * | 2/2003 | Takeya et al. ............... 438/93 |

(Continued)

FOREIGN PATENT DOCUMENTS

EP    0 864 672    9/1998

OTHER PUBLICATIONS

Namkoong et al. "Incorporation of Mg in GaN grown by plasma-assisted molecular beam epitaxy" col 77, No. 26, Dec. 25, 2000, pp. 4386-4388.

(Continued)

*Primary Examiner*—Asok K. Sarkar
*Assistant Examiner*—Victor V. Yevsikov
(74) *Attorney, Agent, or Firm*—Renner, Otto, Boisselle & Sklar, LLP

(57) ABSTRACT

A method of growing a p-type nitride semiconductor material having magnesium as a p-type dopant by molecular beam epitaxy (MBE), comprises supplying ammonia gas, gallium and magnesium to an MBE growth chamber containing a substrate so as to grow a p-type nitride semiconductor material over the substrate. Magnesium is supplied to the growth chamber at a beam equivalent pressure of at least 1 10-9 mbar, and preferably in the range from 1 10-9 mbar to 1 10-7 mbar during the growth process. This provides p-type GaN that has a high concentration of free charge carriers and eliminates the need to activate the magnesium dopant atoms by annealing or irradiating the material.

17 Claims, 2 Drawing Sheets

U.S. PATENT DOCUMENTS

2001/0055871 A1* 12/2001 Takeya et al. .............. 438/604
2004/0053478 A1* 3/2004 Moustakas ................. 438/479
2004/0101012 A1* 5/2004 Nakamura et al. ........... 372/46

OTHER PUBLICATIONS

Einfeldt et al. "Plasma assisted molecular beam epitaxy growth of GaN" vol. 50, No. 1-3, Dec. 18, 1997, pp. 12-15.

Amano et al. "P-type conduction in Mg-Doped GaN treated with low-energy electron beam irradiation ", vol. 28, No. 12, Dec. 1, 1989, pp. L2112-L2114.

Orton et al. "Incorporation of Mg in GaN grown by molecular beam epitaxy" vol. 197, No. 1-2, Feb. 1, 1999, pp. 7-11.

International Search Report regarding International Application No. PCT/JP02/05931 mailed Apr. 28, 2003.

* cited by examiner

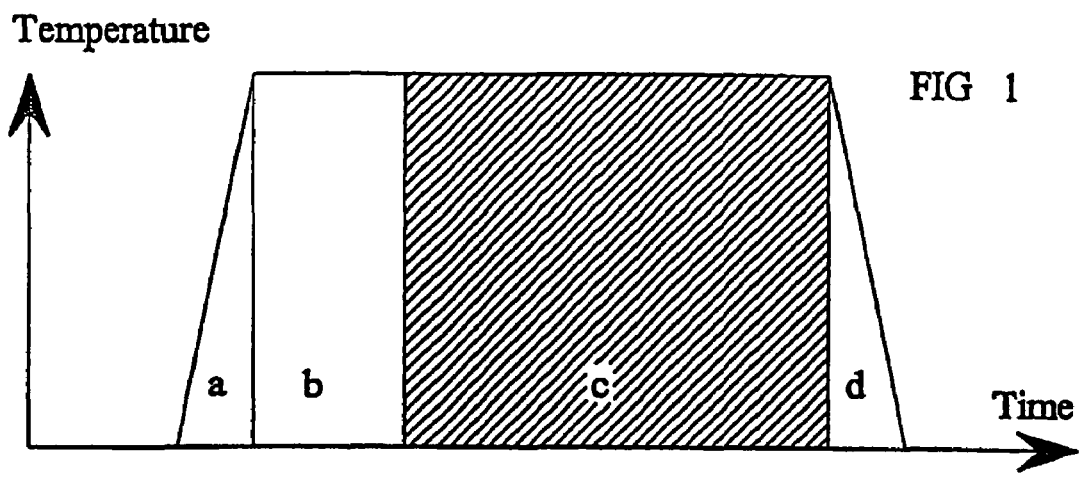
FIG 1
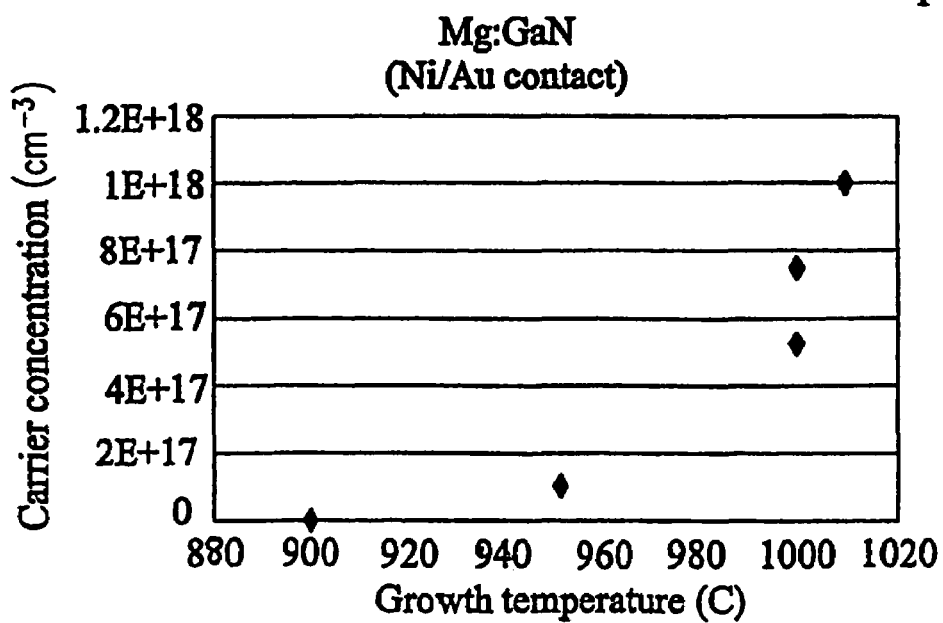
FIG 2 Carrier concentration as a function of substrate temperature Mg:GaN (Ni/Au contact)

METHOD OF GROWING A SEMICONDUCTOR LAYER

TECHNICAL FIELD

This invention relates to a molecular beam epitaxy (MBE) method for the epitaxial growth of Group III nitride semiconductor materials such as, for example, GaN. It particularly relates to the growth of a p-type doped nitride semiconductor material in which magnesium is the p-type dopant.

BACKGROUND ART

Many electronic devices and optoelectronic devices are based on the GaN material family. These devices require at least one interface between an n-type doped material and a p-type doped material, in order to form a p:n junction and/or allow injection of electrical carriers into the device. GaN is naturally an n-type doped semiconductor material, and p-type doped GaN is obtained by introducing a suitable dopant species during the GaN growth process. Magnesium is often used as a p-type dopant for GaN. Many devices require a free carrier concentration in the p-type doped GaN of at least $10^{18}$ cm$^{-3}$, however, and there have been difficulties in obtaining such carrier concentrations in magnesium-doped GaN. This is because only a few percent of magnesium dopant atoms are electrically activated, and the un-activated dopant atoms do not give rise to a free charge carrier. Thus, incorporating magnesium atoms into a semiconductor material may not achieve p-type doping of the material, and a magnesium-doped semiconductor material may even be n-type.

The epitaxial growth of Group III nitride semiconductor materials on a substrate can be effected by molecular beam epitaxy (MBE) or by chemical vapour deposition (CVD) which is sometimes known as Vapour Phase Epitaxy (VPE).

CVD (or VPE) takes place in an apparatus which is commonly at atmospheric pressure but sometimes at a slightly reduced pressure of typically about 10 kPa. Ammonia and the species providing one or more Group III elements to be used in epitaxial growth are supplied, using a carrier gas, substantially parallel to the surface of a substrate upon which epitaxial growth is to take place, thus forming a boundary layer adjacent to and flowing across the substrate surface. It is in this gaseous boundary layer that decomposition to form nitrogen and the other elements to be epitaxially deposited takes place so that the epitaxial growth is driven by gas phase equilibria.

In contrast to CVD, MBE is carried out in a high vacuum environment. In the case of MBE as applied to the GaN system, an ultra-high vacuum (UHV) environment, typically around 1×10$^{-3}$ Pa, is used. Ammonia or another nitrogen precursor is supplied to the MBE chamber by means of a supply conduit and a species providing gallium and, possibly, indium and/or aluminium and/or a dopant species are supplied from appropriate sources within heated effusion cells fitted with controllable shutters to control the amounts of the species supplied into the MBE chamber during the epitaxial growth period. The shutter-control outlets from the effusion cells and the nitrogen supply conduit face the surface of the substrate upon which epitaxial growth is to take place. The ammonia and the species supplied from the effusion cells travel across the MBE chamber and reach the substrate where epitaxial growth takes place in a manner which is driven by the deposition kinetics.

At present, the majority of growth of high quality GaN layers is carried out using the metal-organic chemical vapour deposition (MOCVD) process. The MOCVD process allows good control of the growth of the nucleation layer and of the annealing of the nucleation layer. Furthermore, the MOCVD process allows growth to occur at a V/III ratio well in excess of 1000:1. The V/III ratio is the molar ratio of the group V element to the Group III element during the growth process. A high V/III ratio is preferable, since this allows a higher substrate temperature to be used which in turn leads to a higher quality GaN layer.

At present, growing high quality GaN layers by MBE is more difficult than growing such layers by MOCVD. The principal difficulty is in supplying sufficient nitrogen during the growth process. The two commonly used sources of nitrogen in the MBE growth of nitride layers are plasma excited molecular nitrogen or ammonia.

There have been several reports of the growth of p-type doped GaN by MOCVD, such as, for example U.S. Pat. No. 5,306,662 and H Amano et al in "Japanese Journal of Applied Physics" Part 2, Vol. 28 L2112 (1989). It has generally been found that the magnesium dopant atoms in magnesium-doped GaN grown by MOCVD are inactive, so that post-growth processing is required to activate the magnesium atoms in order to generate free charge carriers. This is because magnesium atoms are passivated if the growth process is carried out in the presence of hydrogen. Large quantities of hydrogen are present in the growth of GaN by MOCVD (arising from the hydrogen carrier gas, and from the decomposition of ammonia gas if this is used as the nitrogen source), and these tend to passivate magnesium-doped GaN. It has generally been found necessary to activate the magnesium-doped GaN grown by MOCVD to obtain a reasonable density of free charge carriers, for example by annealing the material or by irradiating the material with a low energy electron beam.

U.S. Pat. No. 6,043,140 discloses a method of growing magnesium-doped GaN by MOCVD using amine gases as the nitrogen source. Magnesium-doped GaN grown using this method is found to have an acceptable electrical conductivity without the need for an annealing step, but this particular growth method is not relevant to MBE growth.

There have been a number of reports of MBE growth of magnesium-doped GaN that do not require a post-growth annealing or irradiation step. The MBE process does not use hydrogen carrier gas, so that the hydrogen level in a MBE growth system is generally lower than the hydrogen level in a MOCVD growth system; as a result passivation of the obtained magnesium-doped GaN is less of a problem in MBE growth than in MOCVD growth. In particular, many reports of MBE growth of GaN use an activated nitrogen plasma source as the nitrogen precursor rather than ammonia, and this eliminates the presence of hydrogen arising from the decomposition of ammonia.

There have been reports by W Kim et al, in "Applied Physics Letters" Vol 69, p 559 (1996), and by M Leroux et al, in "Journal of Applied Physics" Vol 86, p 3721 (1999), of MBE growth of magnesium-doped GaN in which ammonia is used as the nitrogen precursor. In this case, there will be some hydrogen present during the growth process, since hydrogen gas will be formed from the decomposition of the ammonia. These reports achieve free charge concentrations in the range 3-4.5×10$^{17}$ cm$^{-3}$. However, in both cases the growth temperatures were no higher than 830° C.

G. Namkoong et al. disclose, in "Applied Physics Letters", Vol. 77, No. 26, pp4386-4388 (2000), the incorporation of magnesium into gallium nitride grown by plasma-assisted MBE. However, the growth conditions used are such that, although magnesium is incorporated into the gallium nitride, p-type doping is not shown to be achieved.

DISCLOSURE OF THE INVENTION

A first aspect of the present invention provides a method of growing a p-type-doped nitride semiconductor material by molecular beam epitaxy (MBE), the method comprising the steps of: supplying ammonia gas, gallium and magnesium to an MBE growth chamber containing a substrate thereby to grow a p-type-doped nitride semiconductor material having magnesium as a p-type dopant over the substrate; wherein magnesium is supplied to the growth chamber at a beam equivalent pressure of at least $1 \times 10^{-9}$ mbar.

This method enables the high temperature growth of the nitride semiconductor material, while at the same time providing increased concentration of activated magnesium atoms in the material. As a result, it is possible to grow a p-type doped material that has a free carrier concentration that is sufficiently high for device applications and does not require activation.

Magnesium may be supplied to the growth chamber at a beam equivalent pressure of less than $1 \times 10^{-7}$ mbar.

Gallium may be supplied to the growth chamber at a beam equivalent pressure greater than $1 \times 10^{-8}$ mbar.

Gallium may be supplied to the growth chamber at a beam equivalent pressure of less than $1 \times 10^{-5}$ mbar.

Ammonia may be supplied to the growth chamber at a beam equivalent pressure of less than $1 \times 10^{-2}$ mbar.

Ammonia may be supplied to the growth chamber at a beam equivalent pressure of greater than $1 \times 10^{-4}$ mbar.

The substrate temperature during the growth process may be 850° C. or greater, and it may be 940° C. or greater.

The substrate temperature during the growth process may be 1050° C. or below, and it may be 1010° C. or below.

The p-type doped nitride semiconductor material may be p-type doped gallium nitride.

The substrate may be a GaN substrate. It may comprise an epitaxial layer of GaN disposed over a base substrate.

A second aspect of the present invention provides a method of growing a semiconductor device comprising the steps of: growing a layer of a first nitride semiconductor material over a substrate; and growing a layer of a p-type doped nitride semiconductor material having magnesium as a p-type dopant over the first nitride semiconductor material by a method as defined above.

A third aspect of the present invention provides a method of growing a semiconductor device comprising the steps of: growing a layer of p-type doped nitride semiconductor material having magnesium as a p-type dopant by a method as defined above; and growing a layer of nitride semiconductor material over the p-type doped nitride semiconductor material.

A fourth aspect of the present invention provides a semiconductor device comprising a layer of p-type doped nitride semiconductor material having magnesium as a p-type dopant grown by a method as defined above.

The device may be an (Al,Ga,In)N electronic or optoelectronic device.

BRIEF DESCRIPTION OF THE DRAWINGS

Preferred embodiments of the present invention will now be described by way of illustrative example with reference to the accompanying figures in which:

FIG. 1 is a schematic illustration of a MBE growth process according to the present invention;

FIG. 2 shows the net carrier concentration of a GaN layer grown by a method of the present invention for a range of substrate temperatures.

BEST MODE FOR CARRYING OUT THE INVENTION

Figure 3:
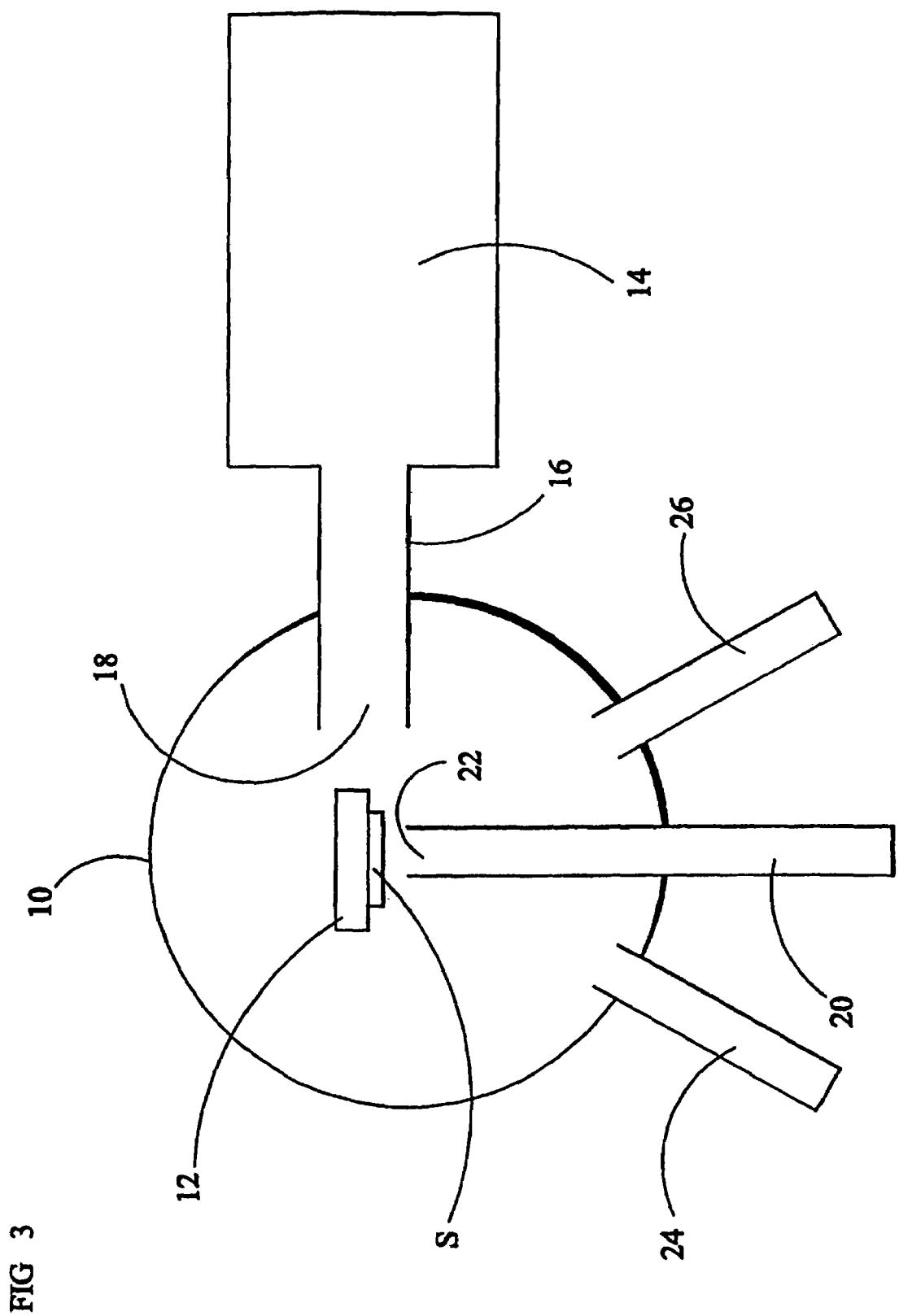
FIG. 3 is a schematic illustration of a MBE apparatus suitable for carrying out the method of the present invention.

One example of a growth method according to the present invention, illustrating the growth of a p-type doped nitride layer having magnesium as a p-type dopant, will now be described. In this embodiment the nitride layer is a p-type GaN layer, but the invention is not limited to the growth of p-type GaN.

A suitable substrate is prepared in any conventional manner, and is introduced into the growth chamber of an MBE apparatus. The substrate is preferably a GaN substrate. A GaN substrate for use in the epitaxial growth of GaN can have two possible forms—it maybe a "free-standing" substrate, or a "template" substrate. A free-standing GaN substrate consists solely of GaN, and is formed by, for example, a GaN crystal. A template GaN substrate consists of a thick epitaxial layer of GaN grown on a base substrate of, for example, sapphire or silicon carbide. The thick epitaxial layer is grown on the base substrate by any suitable technique such as metal-organic vapour phase epitaxy (MOVPE), hydride vapour phase epitaxy (HVPE) or MBE. The epitaxial layer of a GaN template substrate is relatively thick, for example having a thickness in a range 5 μm-100 μm. The base substrate may alternatively be formed of silicon, zinc oxide or magnesium oxide.

Alternatively, the substrate may be a device structure that contains one or more (Al,Ga,In)N layers. (The term "(Al,Ga,In)N" includes materials having the general formula $Al_xGa_yIn_{1-x-y}N$, where $0 \leq x \leq 1$ and $0 \leq y \leq 1$.)

Once the substrate has been prepared and introduced into the growth chamber, the substrate is heated to a desired temperature for MBE growth. The substrate temperature during the growth process is preferably at least 850° C. and particularly preferably is at least 940° C. In practice, the constraints of the MBE apparatus used have been found to limit the substrate temperature obtainable to a maximum temperature of around 1,050° C. A higher substrate temperature is, in principle, obtainable using a method of the present invention, but a maximum substrate temperature of 1,050° C. is acceptable since it corresponds to a typical growth temperature obtainable by an MOCVD process for growing a nitride semiconductor material.

Thus, in the method of the invention, the substrate is initially heated up to a pre-determined temperature of at least 850° C. As noted above, the maximum temperature achievable in practice is likely to be in the order of 1,050° C. This is shown as step (a) in FIG. 1.

The rate at which the temperature of the substrate is increased should not be so great that an uneven temperature distribution might occur in the substrate, since this would set up thermal stresses in the substrate. A temperature ramp rate in the range of 10-120° C. per minute has been found to be acceptable.

GaN tends to decompose when it is heated to a temperature of around 800° C. or above. This decomposition can be prevented by supplying an overpressure of nitrogen gas or ammonia gas to the surface of the GaN. It is therefore preferable to supply ammonia gas to the growth chamber while the substrate temperature is being increased, in order to prevent thermal decomposition of the substrate. In principle, ammonia gas does not need to be supplied at temperatures substantially below 800° C., but it is generally more convenient to supply the ammonia gas for the entire duration of the heating step.

Once the substrate has reached the desired temperature, it is maintained at this temperature to bake the substrate and remove contaminants from the substrate. This is step (b) in FIG. 1. It has been found that a baking step having a duration of between 5 minutes and 30 minutes is suitable.

The supply of ammonia to the growth chamber is preferably maintained during the baking step, to prevent the thermal decomposition of the GaN substrate. Supplying ammonia gas also promotes the removal of contaminants from the surface of the substrate during the baking step, and achieves nitridation of the surface of the substrate.

Once the thermal baking step has been completed, a magnesium-doped nitride layer, in this embodiment a magnesium-doped GaN layer, is grown by molecular beam epitaxy on the substrate. As noted above, ammonia gas is already being supplied to the substrate, and this will act as a source of nitrogen for the MBE growth process. Thus, in order to start the MBE growth of magnesium-doped GaN it is necessary to provide a source of gallium and a source of magnesium. Once gallium and magnesium are supplied to the growth chamber, MBE growth of a GaN layer, into which magnesium is incorporated, over the substrate will occur.

According to the invention, the growth conditions are selected such that the effect of incorporating magnesium into the layer of nitride semiconductor material is to achieve p-type doping of the material. In one embodiment, gallium for the MBE growth process is supplied by a beam of elemental gallium having a beam equivalent pressure in the range $1 \times 10^{-8}$ to $1 \times 10^{-5}$ mbar. A suitable beam equivalent pressure for the supply of ammonia gas during the growth process is between $1 \times 10^{-4}$ and $1 \times 10^{-2}$ mbar. The same beam equivalent pressure of ammonia can be used in the baking step as in the growth step, although it is not necessary to use the same beam equivalent pressure in the baking and growth steps.

In this embodiment, magnesium for the growth process is supplied by a beam of elemental magnesium having a beam equivalent pressure of at least $1 \times 10^{-9}$ mbar. It has been found by the inventors that supplying magnesium at a beam equivalent pressure lower than $1 \times 10^{-9}$ mbar does not reliably result in p-type doping.

A beam equivalent pressure of $1 \times 10^{-7}$ mbar represents a practical upper limit for the beam equivalent pressure of magnesium. Supplying magnesium at a beam equivalent pressure of $1 \times 10^{-7}$ mbar would result in a high rate of consumption of the magnesium source material, but this might be acceptable particularly in growth at high substrate temperatures. In general, however, it is preferable to supply the magnesium at a beam equivalent pressure significantly below $1 \times 10^{-7}$ mbar, to reduce the consumption of magnesium source material. In particular, it has been found that supplying magnesium at a beam equivalent pressure in the range $5 \times 10^{-9}$ to $1 \times 10^{-8}$ mbar provides satisfactory p-type doping of the nitride semiconductor material.

The MBE growth step is step (c) in FIG. 1.

Once the p-type doped GaN layer has been grown to a designed thickness, the growth of p-type doped GaN is halted by stopping the supply of elemental gallium and elemental magnesium to the growth chamber. The substrate is then cooled, and this is shown as step (d) in FIG. 1. The supply of ammonia gas to the substrate is continued while the substrate temperature is reduced in step (d), at least until the temperature of the substrate has fallen to below 800° C., to prevent thermal decomposition of the GaN.

The temperature ramp rate during the step of cooling the substrate must again be chosen to prevent setting up any undue thermal stresses within the substrate, or between the substrate and the p-type doped GaN layer. A temperature ramp rate in the rate of 10-120° C. per minute has again been found to be suitable.

The V/III molar ratio for the MBE growth of the p-type doped GaN layer is preferably greater than 10:1, and is preferably less than 5,000:1. Although a V/III molar ratio greater than 5,000:1 could in principle be used, it has been found that the growth rate is slow if the growth is carried out at a V/III molar ratio significantly above 5,000:1. This high V/III molar ratio allows the p-type doped GaN layer to be grown at a temperature of 850° C. or greater, which is a significantly higher temperature than used in prior art MBE growth of this material. Because the present invention enables a higher growth temperature to be used, the quality of the resultant GaN layer is improved.

FIG. 2 illustrates the free carrier concentration of magnesium-doped GaN obtained by a method of the present invention. It will be seen that the method of present invention achieves p-type doping using magnesium as a p-type dopant, with a significant free carrier concentration being achieved for substrate temperatures greater than approximately 940° C. In the experiments shown in FIG. 2 a free carrier concentration of up to $1 \times 10^{18}$ cm$^{-3}$ was obtained, at a substrate temperature of approximately 1010° C. (the highest substrate temperature used in the experiments). The carrier concentrations shown in FIG. 2 were obtained using room temperature Hall Effect measurements. The results shown in FIG. 2 compare favourably with carrier concentrations of magnesium-doped GaN grown in a MOCVD growth process. Furthermore, the present invention provides both an increased growth temperature, and an increased free carrier concentration compared with prior MBE growth of magnesium doped GaN. There is no need to activate the magnesium dopant atoms by an annealing or irradiation step.

Compared to a typical MOCVD growth process, the MBE growth method of the present invention requires at least 100 times less ammonia gas.

The embodiment described above describes the growth of a single layer of p-type doped GaN, having magnesium as the p-type dopant, on a substrate. This has been done for illustrative purposes. In general, however, a layer of p-type doped GaN, or other p-type nitride, will not be grown in isolation but will be incorporated into a layer structure, for example into a layer structure within an (Al,Ga,In)N electronic or opto-electronic device. Such a device would be obtained growing a series of layers over a suitable substrate, with one (and possibly more) of the layers being a p-type doped nitride semiconductor layer such as a p-type GaN layer. In the growth of a practical opto-electronic or electronic device, therefore, once the baking step (b) has been completed, a series of layers of different compositions will be grown over the substrate, by varying the atomic species that are supplied to the growth chamber appropriately. In this case, the step (c) of growing the p-type doped GaN layer need not directly follow the baking step (b), and the cool down step (d) need not directly follow the step (c) of growing the p-type doped GaN layer.

For example, the growth process described above could be used to grow an electronic or opto-electronic device in which the first layer to be grown is a p-type doped GaN layer and, in this case, one or more other (Al,Ga,In)N layers would be grown after the completion of the step (c) of growing the p-type doped GaN layer but before the cool down step (d). Alternatively, the p-type-doped GaN layer could be the last layer of the electronic or opto electronic device and, in this case, one or more other (Al,Ga,In)N layers would be grown over the substrate after the completion of the baking step (b) and before the start of the step (c) of growing the p-type doped GaN layer. As a further alternative the p-type doped GaN layer could be an intermediate layer in an electronic or opto-electronic device and, in this case, one or more (Al,Ga,In)N layers would be grown after the completion of the baking step (b) before the start of the step (c) of growing the p-type doped GaN layer, and one or more further (Al,Ga,In)N layers would be grown after the completion of the step (c) of growing the p-type doped GaN layer before the cool down step (d).

FIG. 3 is a schematic view of an apparatus suitable for the growth of a nitride semiconductor material by molecular beam epitaxy according to a method of the present invention. The apparatus comprises a growth chamber 10 in which is disposed a heated support 12 arranged to support and heat a substrate S. The growth chamber 10 is connected with an ultra-high vacuum pump 14 via an exhaust conduit 16 which extends into the growth chamber 10. The inner end of the exhaust conduit 16 defines a vacuum outlet 18 of the growth chamber 10. The vacuum outlet 18 is disposed adjacent to the substrate support 12.

The growth chamber 10 is further provided with a first supply conduit 20 which extends into the growth chamber so that an outlet 22 of the first supply conduit 20 is adjacent to and faces the surface of the substrate S upon which epitaxial growth is to take place. The first supply conduit 20 can be adjustably mounted relative to the chamber so that the relatively small distance between the outlet 22 of the first supply conduit 20 and the epitaxial growth surface of the substrate Scan be varied during the epitaxial growth process. The longitudinal axis of the first supply conduit 20 is substantially perpendicular to the plane of epitaxial growth.

The first supply conduit 20 is used to supply ammonia which is the precursor of the nitrogen required in the epitaxial growth process. Because the outlet 22 of the first supply conduit 20 is positioned relatively close to the substrate S, a relatively high ammonia vapour pressure is localised at the surface of the epitaxially growing material while still enabling an ultra-high vacuum environment within the growth chamber 10 to be achieved by the pump 14. The high ammonia vapour pressure enables a high V/III ratio to be realised during the growth process.

The apparatus further comprises independently operable, shutter-controlled effusion cells 24, 26 (two such cells are shown in FIG. 3) which contain sources of elemental gallium and magnesium respectively. Additional effusion cells may be provided if it is necessary to supply additional atomic species during the epitaxial growth process. The effusion cells 24 and 26 are conventionally positioned and define second and further supply conduits respectively.

A MBE apparatus of the type described above is described in European Patent Application No. 98301842.5, the contents of which are hereby incorporated by reference. It should be noted, however, that the present invention is not limited to a MBE apparatus of the type described in European Patent Application No. 98301842.5/0 864 672, but can be carried out in any MBE growth apparatus that can provide the required V/III ratio.

INDUSTRIAL APPLICABILITY

As described above, the invention provides an improved method for the growth of a p-type doped nitride semiconductor material. Such a p-type doped nitride semiconductor material is of use in the fabrication of electronic and opto-electronic devices, in particular devices based on the (Al,Ga,In)N materials system.

The invention claimed is:

1. A method of growing a p-type nitride semiconductor material by molecular beam epitaxy (MBE), the method comprising the steps of: supplying ammonia gas, gallium and magnesium to an MBE growth chamber containing a substrate thereby to grow a p-type nitride semiconductor material having magnesium as a p-type dopant over the substrate;

wherein magnesium is supplied to the growth chamber at a beam equivalent pressure of at least $1\times10^{-9}$ mbar, and the p-type nitride semiconductor material does not require activation.

2. A method as claimed in claim 1 wherein magnesium is supplied to the growth chamber at a beam equivalent pressure of less than $1\times10^{-7}$ mbar.

3. A method as claimed in claim 1 wherein gallium is supplied to the growth chamber at a beam equivalent pressure greater than $1\times10^{-8}$ mbar.

4. A method as claimed in claim 1 wherein gallium is supplied to the growth chamber at a beam equivalent pressure of less than $1\times10^{-5}$ mbar.

5. A method as claimed in claim 1 wherein ammonia is supplied to the growth chamber at a beam equivalent pressure of less than $1\times10^{-2}$ mbar.

6. A method as claimed in claim 1 wherein ammonia is supplied to the growth chamber at a beam equivalent pressure of greater than $1\times10^{-4}$ mbar.

7. A method as claimed in claim 1 wherein the substrate temperature during the growth process is 850° C. or greater.

8. A method as claimed in claim 1 wherein the substrate temperature during the growth process is 940° C. or greater.

9. A method as claimed in claim 1 wherein the substrate temperature during the growth process is 1050° C. or below.

10. A method as claimed in claim 1 wherein the substrate temperature during the growth process is 1010° C. or below.

11. A method as claimed in claim 1 wherein the p-type nitride semiconductor material is p-type GaN having magnesium as a p-type dopant.

12. A method as claimed in claim 1 wherein the substrate is a GaN substrate.

13. A method as claimed in claim 12 wherein the substrate comprises an epitaxial layer of GaN disposed over a base substrate.

14. A method of growing a semiconductor device comprising the steps of: growing a layer of a first nitride semiconductor material over a substrate; and growing a layer of a p-type nitride semiconductor material having magnesium as a p-type dopant over the first nitride semiconductor material by a method as defined in claim 1.

15. A method of growing a semiconductor device comprising the steps of: growing a layer of p-type nitride semiconductor material having magnesium as a p-type dopant by a method as defined in claim 1; and growing a layer of nitride semiconductor material over the p-type nitride semiconductor material.

16. A semiconductor device comprising a layer of p-type nitride semiconductor material having magnesium as a p-type dopant grown by a method as defined in claim 1.

17. A device as claimed in claim 16 wherein the device is an (Al, Ga,In)N electronic or opto electronic device.

* * * * *